United States Patent
Kulkarni et al.

(10) Patent No.: US 9,267,369 B2
(45) Date of Patent: Feb. 23, 2016

(54) MODELING INTERSECTING FLOW PATHS IN A WELL SYSTEM ENVIRONMENT

(71) Applicant: Halliburton Energy Services, Inc., Houston, TX (US)

(72) Inventors: Pandurang Manohar Kulkarni, Houston, TX (US); Dinesh Ananda Shetty, Houston, TX (US); Avi Lin, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 328 days.

(21) Appl. No.: 13/965,357

(22) Filed: Aug. 13, 2013

(65) Prior Publication Data
US 2015/0051878 A1 Feb. 19, 2015

(51) Int. Cl.
*G06G 7/48* (2006.01)
*E21B 43/26* (2006.01)

(52) U.S. Cl.
CPC .................................... *E21B 43/26* (2013.01)

(58) Field of Classification Search
CPC .......... E21B 43/26; E21B 49/00; G01V 99/00
See application file for complete search history.

(56) References Cited

U.S. PATENT DOCUMENTS

| | | | | |
|---|---|---|---|---|
| 2010/0032156 A1* | 2/2010 | Petty | ....................... | E21B 43/26 166/252.1 |
| 2011/0120718 A1* | 5/2011 | Craig | ....................... | E21B 43/26 166/308.1 |
| 2011/0290478 A1* | 12/2011 | Sun | ....................... | G01V 99/00 166/250.01 |
| 2012/0179436 A1* | 7/2012 | Fung | ....................... | E21B 49/00 703/2 |
| 2013/0124178 A1* | 5/2013 | Bowen | ..................... | E21B 43/26 703/10 |
| 2013/0204588 A1* | 8/2013 | Copeland | ................ | E21B 43/26 703/2 |

OTHER PUBLICATIONS

MFrac—3D Hydraulic Fracturing Simulator, Baker Hughes, copyright 1983-2013, accessed online Jul. 2013 at www.mfrac.com/mfrac.html, 2 pages.
"Meyer Fracturing Simulators," Meyer & Associates, Inc. User's Guide, Ninth Edition, copyright 2011, 1022 pages.
Mangrove Reservoir-Centric Stimulation Design Software, Schlumberger, copyright 2013, accessed online Jul. 2013 at http://www.slb.com/services/completions/stimulation/execution/mangrove.aspx, 1 page.
Mangrove Reservoir-Centric Stimulation Design Software, Schlumberger, copyright 2013, accessed online Jul. 2013 at http://www.slb.com/~/media/Files/stimulation/product_sheets/design/mangrove_ps.pdf, 2 pages.

(Continued)

*Primary Examiner* — Kandasamy Thangavelu
(74) *Attorney, Agent, or Firm* — Holly Soehnge; Fish & Richardson P.C.

(57) ABSTRACT

In some aspects, techniques and systems for modeling fluid flow are described. A flow model represents intersecting flow paths for well system fluid. The flow paths intersect at a flow path intersection. A band matrix and an intersection table are generated based on the flow model. The band matrix represents fluid flow within the respective flow paths, and the intersection table represents fluid flow between the flow paths at the flow path intersection. The flow model can be operated using the band matrix and the intersection table, for example, to calculate fluid flow variables at various locations along the flow paths.

26 Claims, 8 Drawing Sheets

(56) References Cited

OTHER PUBLICATIONS

Itasca: Software: UDEC: Overview, copyright 2013, accessed online Jul. 2013 at http://www.itascacg.com/udec/overview.php, 1 page.

"Welcome to the family," Knoesis Halliburton Production Enhancement, Oct. 2012, 8 pages.

Tridiagonal matrix algorithm, Wikipedia, Online. http://en.wikipedia.org/wiki/Tridiagonal_matrix_algorithm, last modified Jun. 26, 2013, 6 pages.

Finite difference, Wikipedia, Online: http://en.wikipedia.org/wiki/Finite_difference, version last modified Jun. 21, 2013, 7 pages.

Kresse, O., "Numerical Modeling of Hydraulic Fracturing in Naturally Fractured Formations," ARMA 11-363, American Rock Mechanics Association, Geomechanics Symposium, San Francisco, CA, Jun. 26-29, 2011, 11 pages.

Kamath, J., et al., "Modeling Fluid Flow in Complex Naturally Fractured Reservoirs," SPE 39547, Society of Petroleum Engineers, SPE India Oil and Gas Conference and Exhibition, New Delhi, India, Apr. 7-9, 1998, 5 pages.

Weng, X., et al., "Modeling of Hydraulic-Fracture-Network Propagation in a Naturally Fractured Formation," SPE 140253, Society of Petroleum Engineers, SPE Production & Operations, Nov. 2011, pp. 368-380, 13 pages.

Tian, Z.F., et al., "A fourth-order compact ADI method for solving two-dimensional unsteady convection-diffusion problems," Journal of Computational and Applied Mathematics 198 (2007), pp. 268-286, 19 pages.

\* cited by examiner

MODELING INTERSECTING FLOW PATHS IN A WELL SYSTEM ENVIRONMENT

BACKGROUND

The following description relates to modeling intersecting flow paths, for example, in a fracture network in a subterranean region.

Flow models have been used to simulate fluid flow in hydraulic fracture treatments and other environments. During a conventional fracture treatment of a subterranean reservoir, pressurized fluid is communicated from a wellbore into the reservoir at high pressure, and the pressurized fluid propagates fractures within the reservoir rock. Flow models can be used to simulate the flow of fluid, for example, within a fracture network.

DESCRIPTION OF DRAWINGS

Like reference symbols in the various drawings indicate like elements.

DETAILED DESCRIPTION

Fluid flow models can be used to analyze fluid flow, for example, in a well system environment (e.g., in a wellbore, a fracture network, within a reservoir rock matrix, in a well system tool, etc.) or other environments. In some environments, the fluid flow is unsteady and multi-dimensional (e.g., three-dimensional or at least two-dimensional). For example, in some types of fractures, the dominant flow is two-dimensional, and includes transient behaviors. In some instances, two- or three-dimensional flow can be described by a one-dimensional flow model, for example, by integrating the governing flow equations over the cross-section of the two- or three-dimensional flow path. In some cases, the resulting equations can include nonlinear partial differential equations that can be solved, for example, using finite difference, finite volume, or finite element methods. In some cases, the use of one-dimensional flow models can reduce computational costs, and allow for faster or more computationally efficient simulations. In some instances, a flow model can be used to perform numerical simulations in real time, for example, during a fracture treatment or during another well system activity.

The flow equations for multiple intersecting flow paths in a one-dimensional flow model can be represented as a coupled initial boundary value problem. In some instances, a solver can obtain a numerical solution to the flow equations. In some cases, the equations can be solved by an implicit approach, such as, for example, the backward Euler or Crank-Nicolson schemes. Implicit schemes can provide unconditional stability and obtain a solution of a system of linear algebraic equations. In some cases, the equations can be solved by a direct approach. For example, in some cases, a fast and robust direct solver can be used to solve a coupled initial boundary value problem that represents flow in a complex fracture network. In some instances, a direct solver can be used within the implicit finite difference numerical framework. For example, the finite difference technique can be solved implicitly, and spatial derivatives can be solved using the first order central/upwind difference technique or another technique.

Figure 1:
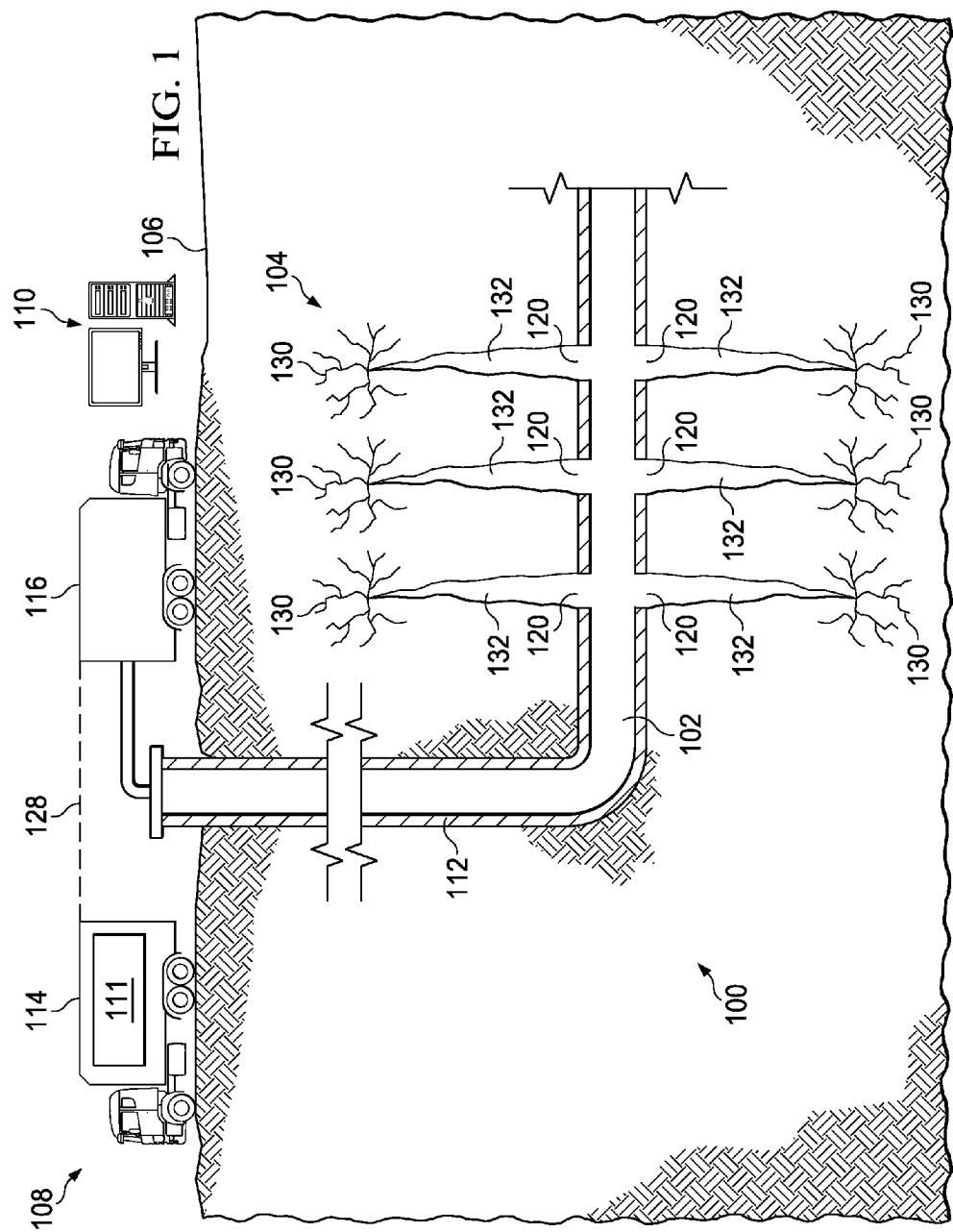
FIG. 1 is a schematic diagram of an example well system.

FIG. 1 is a diagram of an example well system 100 and a computing subsystem 110. The example well system 100 includes a wellbore 102 in a subterranean region 104 beneath the ground surface 106. The example wellbore 102 shown in FIG. 1 includes a horizontal wellbore. However, a well system may include any combination of horizontal, vertical, slant, curved, or other wellbore orientations. The well system 100 can include one or more additional treatment wells, observation wells, or other types of wells.

The computing subsystem 110 can include one or more computing devices or systems located at the wellbore 102 or other locations. The computing subsystem 110 or any of its components can be located apart from the other components shown in FIG. 1. For example, the computing subsystem 110 can be located at a data processing center, a computing facility, or another suitable location. The well system 100 can include additional or different features, and the features of the well system can be arranged as shown in FIG. 1 or in another configuration.

The example subterranean region 104 may include a reservoir that contains hydrocarbon resources, such as oil, natural gas, or others. For example, the subterranean region 104 may include all or part of a rock formation (e.g., shale, coal, sandstone, granite, or others) that contain natural gas. The subterranean region 104 may include naturally fractured rock or natural rock formations that are not fractured to any significant degree. The subterranean region 104 may include tight gas formations that include low permeability rock (e.g., shale, coal, or others).

The example well system 100 shown in FIG. 1 includes an injection system 108. The injection system 108 can be used to perform an injection treatment, whereby fluid is injected into the subterranean region 104 through the wellbore 102. In some instances, the injection treatment fractures part of a rock formation or other materials in the subterranean region 104. In such examples, fracturing the rock may increase the surface area of the formation, which may increase the rate at which the formation conducts fluid resources to the wellbore 102.

The example injection system 108 can inject treatment fluid into the subterranean region 104 from the wellbore 102. For example, a fracture treatment can be applied at a single fluid injection location or at multiple fluid injection locations in a subterranean zone, and the fluid may be injected over a single time period or over multiple different time periods. In some instances, a fracture treatment can use multiple different fluid injection locations in a single wellbore, multiple fluid injection locations in multiple different wellbores, or any suitable combination. Moreover, the fracture treatment can inject fluid through any suitable type of wellbore, such as, for example, vertical wellbores, slant wellbores, horizontal wellbores, curved wellbores, or combinations of these and others.

The example injection system 108 includes instrument trucks 114, pump trucks 116, and an injection treatment control subsystem 111. The example injection system 108 may include other features not shown in the figures. The injection system 108 may apply injection treatments that include, for example, a multi-stage fracturing treatment, a single-stage fracture treatment, a mini-fracture test treatment, a follow-on fracture treatment, a re-fracture treatment, a final fracture treatment, other types of fracture treatments, or a combination of these.

The pump trucks 116 can include mobile vehicles, immobile installations, skids, hoses, tubes, fluid tanks, fluid reservoirs, pumps, valves, mixers, or other types of structures and equipment. The example pump trucks 116 shown in FIG. 1 can supply treatment fluid or other materials for the injection treatment. The example pump trucks 116 can communicate treatment fluids into the wellbore 102 at or near the level of the ground surface 106. The treatment fluids can be communicated through the wellbore 102 from the ground surface 106 level by a conduit installed in the wellbore 102. The conduit 112 may include casing cemented to the wall of the wellbore 102. In some implementations, all or a portion of the wellbore 102 may be left open, without casing. The conduit 112 may include a working string, coiled tubing, sectioned pipe, or other types of conduit.

The instrument trucks 114 can include mobile vehicles, immobile installations, or other suitable structures. The example instrument trucks 114 shown in FIG. 1 include an injection treatment control subsystem 111 that controls or monitors the injection treatment applied by the injection system 108. The communication links 128 may allow the instrument trucks 114 to communicate with the pump trucks 116, or other equipment at the ground surface 106. Additional communication links may allow the instrument trucks 114 to communicate with sensors or data collection apparatus in the well system 100, remote systems, other well systems, equipment installed in the wellbore 102 or other devices and equipment. In some implementations, communication links allow the instrument trucks 114 to communicate with the computing subsystem 110 that can run simulations and provide simulation data. The well system 100 can include multiple uncoupled communication links or a network of coupled communication links. The communication links can include wired or wireless communications systems, or a combination thereof.

The injection system 108 may also include surface and down-hole sensors to measure pressure, rate, temperature or other parameters of treatment or production. For example, the injection system 108 may include pressure meters or other equipment that measure the pressure of fluids in the wellbore 102 at or near the ground surface 106 level or at other locations. The injection system 108 may include pump controls or other types of controls for starting, stopping, increasing, decreasing or otherwise controlling pumping as well as controls for selecting or otherwise controlling fluids pumped during the injection treatment. The injection treatment control subsystem 111 may communicate with such equipment to monitor and control the injection treatment.

The injection system 108 may inject fluid into the formation above, at or below a fracture initiation pressure for the formation; above, at or below a fracture closure pressure for the formation; or at another fluid pressure. Fracture initiation pressure may refer to a minimum fluid injection pressure that can initiate or propagate fractures in the subterranean formation. Fracture closure pressure may refer to a minimum fluid injection pressure that can dilate existing fractures in the subterranean formation. In some instances, the fracture closure pressure is related to the minimum principle stress acting on the formation.

The example injection treatment control subsystem 111 shown in FIG. 1 controls operation of the injection system 108. The injection treatment control subsystem 111 may include data processing equipment, communication equipment, or other systems that control injection treatments applied to the subterranean region 104 through the wellbore 102. The injection treatment control subsystem 111 may be communicably linked to the computing subsystem 110 that can calculate, select, or optimize fracture treatment parameters for initialization, propagation, or opening fractures in the subterranean region 104. The injection treatment control subsystem 111 may receive, generate or modify an injection treatment plan (e.g., a pumping schedule) that specifies properties of an injection treatment to be applied to the subterranean region 104.

In the example shown in FIG. 1, an injection treatment has fractured the subterranean region 104. FIG. 1 shows examples of dominant fractures 132 formed by fluid injection through perforations 120 along the wellbore 102. Generally, the fractures can include fractures of any type, number, length, shape, geometry or aperture. Fractures can extend in any direction or orientation, and they may be formed at multiple stages or intervals, at different times or simultaneously. The example dominant fractures 132 shown in FIG. 1 extend through natural fracture networks 130. Generally, fractures may extend through naturally fractured rock, regions of unfractured rock, or both. The injected fracturing fluid can flow from the dominant fractures 132, into the rock matrix, into the natural fracture networks 130, or in other locations in the subterranean region 104. The injected fracturing fluid can, in some instances, dilate or propagate the natural fractures or other pre-existing fractures in the rock formation.

In some implementations, the computing subsystem 110 can simulate fluid flow in the well system 100. For example, the computing subsystem 110 can include flow models for simulating fluid flow in or between various locations of fluid flow in the well system, such as, for example, the wellbore 102, the perforations 120, the conduit 112 or components thereof, the dominant fractures 132, the natural fracture networks 130, the rock media in the subterranean region 104, or a combination of these and others. The flow models can model the flow of incompressible fluids (e.g., liquids), compressible fluids (e.g., gases), or a combination multiple fluid phases. In some instances, the flow models can model flow in one, two, or three spatial dimensions. The flow models can include nonlinear systems of differential or partial differential equations. The computing subsystem 110 can use the flow models to predict, describe, or otherwise analyze the dynamic behavior of fluid in the well system 100.

The computing subsystem 110 can perform simulations before, during, or after the injection treatment. In some implementations, the injection treatment control subsystem 111 controls the injection treatment based on simulations performed by the computing subsystem 110. For example, a pumping schedule or other aspects of a fracture treatment plan can be generated in advance based on simulations performed by the computing subsystem 110. As another example, the injection treatment control subsystem 111 can modify, update, or generate a fracture treatment plan based on simulations performed by the computing subsystem 110 in real time during the injection system.

In some cases, the simulations are based on data obtained from the well system 100. For example, pressure meters, flow monitors, microseismic equipment, tiltmeters, or other equipment can perform measurements before, during, or after an injection treatment; and the computing subsystem 110 can simulate fluid flow based on the measured data. In some cases, the injection treatment control subsystem 111 can select or modify (e.g., increase or decrease) fluid pressures, fluid densities, fluid compositions, and other control parameters based on data provided by the simulations. In some instances, data provided by the simulations can be displayed in real time during the injection treatment, for example, to an engineer or other operator of the well system 100.

Some of the techniques and operations described herein may be implemented by a one or more computing systems configured to provide the functionality described. In various instances, a computing system may include any of various types of devices, including, but not limited to, personal computer systems, desktop computers, laptops, notebooks, mainframe computer systems, handheld computers, workstations, tablets, application servers, computer clusters, storage devices, or any type of computing or electronic device.

Figure 2:
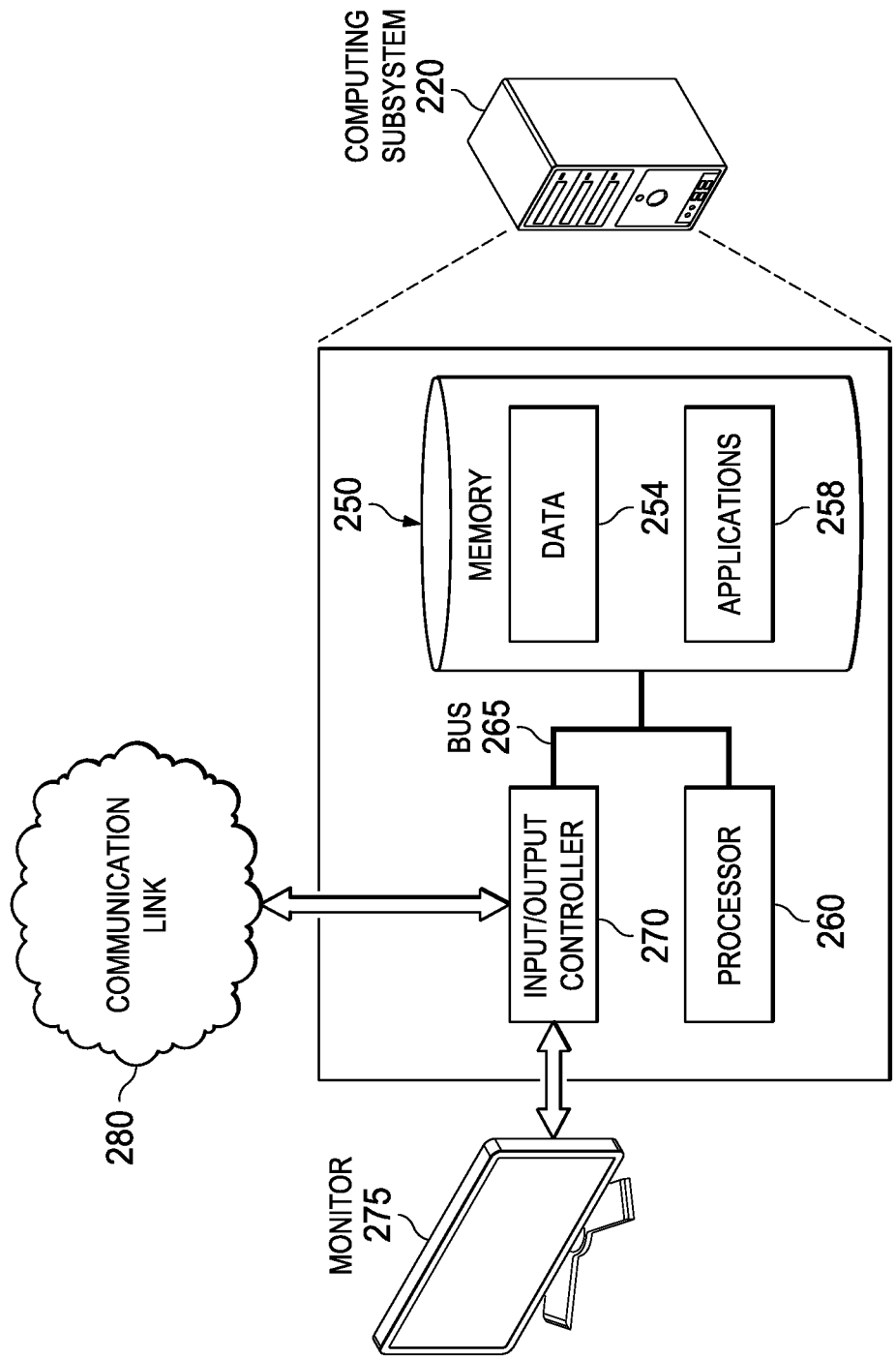
FIG. 2 is a schematic diagram of an example computing system.

FIG. 2 is a diagram of an example computing system 200. The example computing system 200 can operate as the example computing subsystem 110 shown in FIG. 1, or it may operate in another manner. For example, the computing system 200 can be located at or near one or more wells of a well system or at a remote location apart from a well system. All or part of the computing system 200 may operate independent of a well system or well system components. The example computing system 200 includes a memory 250, a processor 260, and input/output controllers 270 communicably coupled by a bus 265. The memory 250 can include, for example, a random access memory (RAM), a storage device (e.g., a writable read-only memory (ROM) or others), a hard disk, or another type of storage medium. The computing system 200 can be preprogrammed or it can be programmed (and reprogrammed) by loading a program from another source (e.g., from a CD-ROM, from another computer device through a data network, or in another manner). In some examples, the input/output controller 270 is coupled to input/output devices (e.g., a monitor 275, a mouse, a keyboard, or other input/output devices) and to a communication link 280. The input/output devices can receive or transmit data in analog or digital form over communication links such as a serial link, a wireless link (e.g., infrared, radio frequency, or others), a parallel link, or another type of link.

The communication link 280 can include any type of communication channel, connector, data communication network, or other link. For example, the communication link 280 can include a wireless or a wired network, a Local Area Network (LAN), a Wide Area Network (WAN), a private network, a public network (such as the Internet), a WiFi network, a network that includes a satellite link, or another type of data communication network.

The memory 250 can store instructions (e.g., computer code) associated with an operating system, computer applications, and other resources. The memory 250 can also store application data and data objects that can be interpreted by one or more applications or virtual machines running on the computing system 200. As shown in FIG. 2, the example memory 250 includes data 254 and applications 258. The data 254 can include treatment data, geological data, fracture data, fluid data, or any other appropriate data. The applications 258 can include flow models, fracture treatment simulation software, reservoir simulation software, or other types of applications. In some implementations, a memory of a computing device includes additional or different data, application, models, or other information.

In some instances, the data 254 include treatment data relating to fracture treatment plans. For example the treatment data can indicate a pumping schedule, parameters of a previous injection treatment, parameters of a future injection treatment, or parameters of a proposed injection treatment. Such parameters may include information on flow rates, flow volumes, slurry concentrations, fluid compositions, injection locations, injection times, or other parameters.

In some instances, the data 254 include geological data relating to geological properties of a subterranean region. For example, the geological data may include information on wellbores, completions, or information on other attributes of the subterranean region. In some cases, the geological data includes information on the lithology, fluid content, stress profile (e.g., stress anisotropy, maximum and minimum horizontal stresses), pressure profile, spatial extent, or other attributes of one or more rock formations in the subterranean zone. The geological data can include information collected from well logs, rock samples, outcroppings, microseismic imaging, or other data sources.

In some instances, the data 254 include fracture data relating to fractures in the subterranean region. The fracture data may identify the locations, sizes, shapes, and other properties of fractures in a model of a subterranean zone. The fracture data can include information on natural fractures, hydraulically-induced fractures, or any other type of discontinuity in the subterranean region. The fracture data can include fracture planes calculated from microseismic data or other information. For each fracture plane, the fracture data can include information (e.g., strike angle, dip angle, etc.) identifying an orientation of the fracture, information identifying a shape (e.g., curvature, aperture, etc.) of the fracture, information identifying boundaries of the fracture, or any other suitable information.

In some instances, the data 254 include fluid data relating to well system fluids. The fluid data may identify types of fluids, fluid properties, thermodynamic conditions, and other information related to well system fluids. The fluid data can include flow models for compressible or incompressible fluid flow. For example, the fluid data can include systems of governing equations (e.g., Navier-Stokes equations, advection-diffusion equations, continuity equations, etc.) that represent fluid flow generally or fluid flow under certain types of conditions. In some cases, the governing flow equations define a nonlinear system of equations. The fluid data can include data related to native fluids that naturally reside in a subterranean region, treatment fluids to be injected into the subterranean region, hydraulic fluids that operate well system tools, or other fluids that may or may not be related to a well system.

The applications 258 can include software applications, scripts, programs, functions, executables, or other modules that are interpreted or executed by the processor 260. For example, the applications 258 can include a fluid flow simulation module, a hydraulic fracture simulation module, a reservoir simulation module, or another other type of simulator. The applications 258 may include machine-readable instructions for performing one or more of the operations related to FIGS. 3-5. The applications 258 may include machine-readable instructions for generating a user interface or a plot, for example, illustrating fluid flow or fluid properties. The applications 258 can receive input data, such as treatment data, geological data, fracture data, fluid data, or other types of input data, from the memory 250, from another local source, or from one or more remote sources (e.g., via the communication link 280). The applications 258 can generate output data and store the output data in the memory 250, in another local medium, or in one or more remote devices (e.g., by sending the output data via the communication link 280).

The processor 260 can execute instructions, for example, to generate output data based on data inputs. For example, the processor 260 can run the applications 258 by executing or interpreting the software, scripts, programs, functions, executables, or other modules contained in the applications 258. The processor 260 may perform one or more of the operations related to FIGS. 3-5. The input data received by the processor 260 or the output data generated by the processor 260 can include any of the treatment data, the geological data, the fracture data, or any other data 254.

Figure 3:
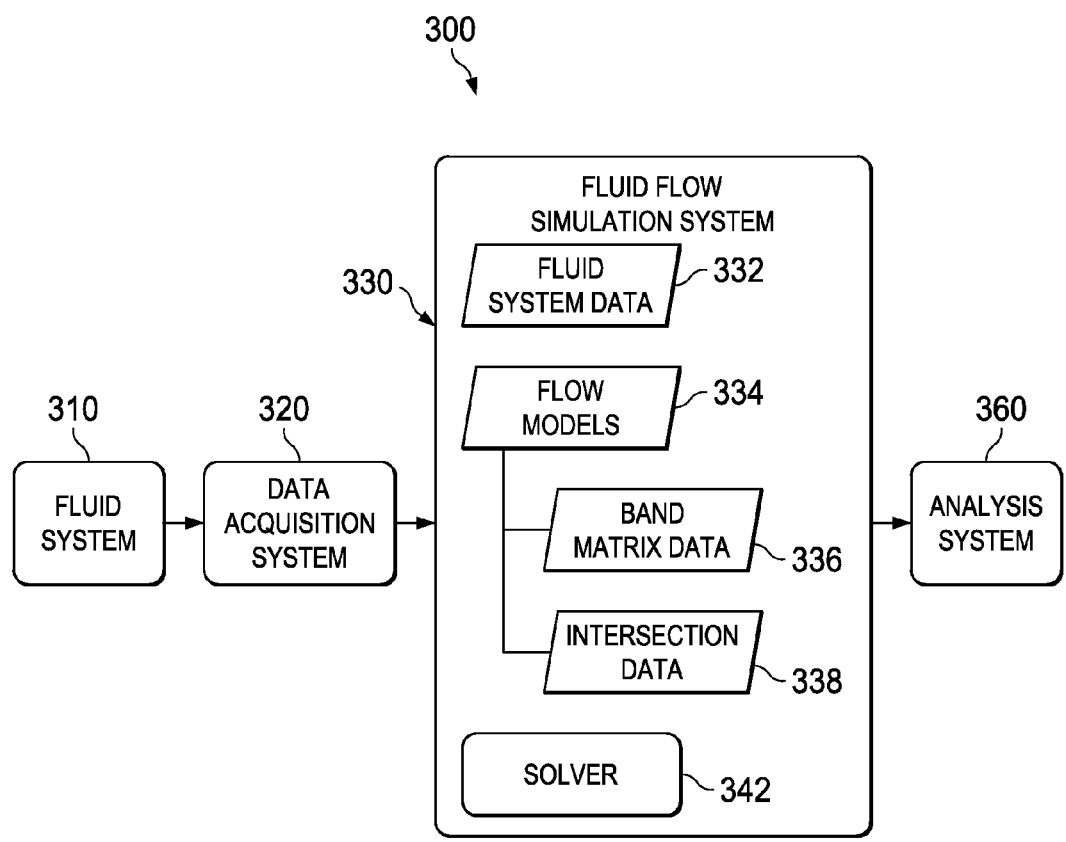
FIG. 3 is a diagram of an example system architecture.

FIG. 3 is a diagram of an example system architecture 300. The example system architecture 300 can be used to model physical phenomena related to a well system environment. For example, the architecture 300 can be used to model fluid flow in an injection treatment of the subterranean region 104 shown in FIG. 1. In some instances, the architecture 300 is used to model fluid flow and other aspects of an injection treatment or other activities in a well system. In some cases, the architecture 300 is used to model fluid flow within or between one or more wellbores, wellbore conduits, wellbore tools, wellbore perforations, reservoir rock media, reservoir fractures (e.g., fractures in a complex fracture network, in a dominant bi-wing fracture extending from a wellbore, in a natural fracture network, in hydraulically-induced fractures, etc.), or combinations of these and other types of flow paths in a well system environment.

The example architecture 300 shown in FIG. 3 includes a fluid system 310, a data acquisition system 320, a fluid flow simulation system 330, and an analysis system 360. The architecture 300 can include additional or different components or subsystems, and the example components shown in FIG. 3 can be combined, integrated, divided, or configured in another manner. For example, the fluid flow simulation system 330 and the analysis system 360 can be subcomponents of an integrated computing system (e.g., the computing system 200 shown in FIG. 2) or multiple computing systems; or the data acquisition system 320 can be integrated with the fluid system 310. As another example, the fluid flow simulation system 330 or the analysis system 360, or both, can be implemented in a computing system that operates independent of the fluid system 310 or the data acquisition system 320.

The example fluid system 310 can be any physical system where fluid flow or other fluid phenomena occur. The fluid system 310 can represent a well system environment (e.g., the well system 100 shown in FIG. 1) or a subset of well system components or subsystems (e.g., the injection system 108 shown in FIG. 1). The fluid system 310 can represent the physical reservoir rock in a subterranean reservoir (e.g., the subterranean region 104 shown in FIG. 1), fractures or a fracture network in the reservoir rock, one or more downhole systems installed in a wellbore, or a combination of them.

The data acquisition system 320 can be any systems or hardware that obtains data from the fluid system 310. For example, the data acquisition system 320 can include flow sensors, pressure sensors, temperature sensors, and other types of measurement devices. The data acquisition system 320 can include communication and data storage systems that store, transfer, manipulate, or otherwise manage the information obtained from the fluid system. In some examples, the data acquisition system 320 obtains fluid pressure data for one or more points on a flow path.

The fluid flow simulation system 330 can be one or more computer systems or computer-implemented programs that simulate fluid flow. The fluid flow simulation system 330 can receive information related to the fluid system 310 and simulate fluid flow and other fluid phenomena that occur in the fluid system 310. For example, the fluid flow simulation system 330 can calculate flow velocities or other aspects of fluid flow based on data from the data acquisition system 320 or another source.

The example fluid flow simulation system 330 includes fluid system data 332, flow models 334, and a solver 342. The fluid flow simulation system can include additional or different features, and the features of a fluid flow simulation system 330 can be configured to operate in another manner. The modules of the fluid flow simulation system 330 can include hardware modules, software modules, or other types of modules. In some cases, the modules can be integrated with each other or with other system components. In some example implementations, the fluid flow simulation system 330 can be implemented as software running on a computing system, and the modules of the fluid flow simulation system 330 can be implemented as software functions or routines that are executed by the computing system.

The fluid system data 332 can include any information related to the fluid system 310 or another fluid system. For example, the fluid system data 332 can indicate physical properties (e.g., geometry, surface properties, etc.) of one or more flow paths in the fluid system 310, material properties (e.g., density, viscosity, Reynolds number, etc.) of one or more fluids in the fluid system 310, thermodynamic data (e.g., fluid pressures, fluid temperatures, fluid flow rates, etc.) measured at one or more locations in the fluid system 310, and other types of information. The fluid system data 332 can include information received from the data acquisition system 320 and other sources.

The flow models 334 can include any information or modules that can be used to simulate fluid flow. The flow models 334 can include governing equations, spatial and temporal discretization data, or other information. In some examples, the flow models 334 include governing flow equations, such as, for example, the Navier-Stokes equation or related approximations of the Navier-Stokes equations, continuity equations, or other types of flow equations. As an example, the flow models 334 may include Equations (1) and (2) below; or the flow models 334 may include additional or different governing flow equations.

The flow models 334 can include spatial discretization data, such as, for example, discrete nodes that represent locations of fluid flow along flow paths in the fluid system 310. Generally, the flow models 334 can represent any number of intersecting flow paths, including any type of flow path intersection. In some cases, the flow paths represent a fracture network in a subterranean region, and connectivity between the flow paths can correspond to the fracture connectivity in the fracture network. In some cases, the flow paths represent flow conduits in a wellbore, perforations in a wellbore casing, hydraulic fractures extending from a wellbore, natural fractures connected to hydraulic fractures or a wellbore, or other types of interconnected flow paths in a well system environment.

Each of the flow paths can be represented by multiple discrete nodes, and some of the nodes can be shared among multiple flow paths. For example, in some cases, two, three, four, or more flow paths intersect at a single intersection node. In some cases, two or more intersecting flow paths cross each other and share an intersection node between the flow paths' respective end points. In some cases, a branch flow path extends from a main flow path, and the intersection node is an end point of the branch flow path. In some cases, the branch flow path can define a loop that returns to the main flow path at another intersection node.

The spatial discretization of the flow paths can be implemented by any suitable algorithm. For example, the system can be discretized according to a finite difference model, a finite volume model, finite element model, or another technique. The system can be discretized in a manner that permits spatial derivatives or partial spatial derivatives to be solved in the discretized spatial domain using numerical methods. In some implementations, the central difference method can be used in the spatial domain. In some implementations, the flow models 334 can include boundary condition data indicating a type of boundary condition to be used in modeling fluid flow.

As shown in FIG. 3, the fluid flow simulation system 330 can also include band matrix data 336 and intersection data 338. The band matrix data 336 can include a band matrix and other related information. The band matrix can represent fluid flow within one or more one-dimensional flow paths, as provided by the flow models 334. For example, the band matrix can include values derived from the discretized governing flow equations, describing fluid flow between nodes that are connected within the same flow path.

In some implementations, all non-zero elements of the band matrix reside at matrix positions within a bandwidth about the main diagonal (including the main diagonal); in other words, all elements outside the bandwidth of the band matrix can be zero. For example, a band matrix B having m rows and a bandwidth of $2\beta+1$, can include non-zero elements at matrix positions B (i±b, i), for all values of i=1 . . . m and b=0 . . . $\beta$ that correspond to valid matrix positions. In this notation, the matrix positions B (i, i) are on the main diagonal, and the valid matrix positions B (i±b, i), for b=1 . . . $\beta$ are within the bandwidth about the main diagonal. In a band matrix, the matrix positions in the bandwidth (including the main diagonal and all positions within the bandwidth about the main diagonal) can be referred to as "in-band" positions, and the matrix positions outside the bandwidth can be referred to as "off-band" positions.

The band matrix data 336 can be stored in any suitable form. For example, the band matrix can be stored in full matrix form, including all elements in the bandwidth and all zeros outside the bandwidth. Or the band matrix can be stored in a more compact form. In some cases, the band matrix can be stored as one or more vectors that include all matrix elements in the bandwidth, without explicitly storing the zeros outside the bandwidth. For example, a band matrix having a bandwidth of three (i.e., a tri-diagonal matrix) can be stored as three vectors: a first vector for the elements of the main diagonal, a second vector for the elements one position above the main diagonal, and a third vector for the elements one position below the main diagonal. Similarly, a band matrix having a bandwidth of five (i.e., a penta-diagonal matrix) can be stored as five vectors. The band matrix can be store in another manner, for example, using a different number of vectors or a different type of data structure.

The intersection data 338 can include one or more intersection tables and other related information. The intersection data 338 can include an intersection table that represents fluid flow between intersecting flow paths, as provided by the flow models 334. For example, the intersection table can include values derived from the discretized governing flow equations, describing fluid flow between an intersection node in one flow path and another node in a connected flow path. The number of elements in the intersection table can depend, for example, on the number of flow path intersections in the flow model, the spatial discretization of the flow paths, the governing flow equations, or a combination of these and other factors.

In some implementations, the intersection data 338 can supplement the band matrix data 336. For example, in cases where the band matrix describes the flow dynamics within the individual flow paths, the band matrix by itself may not fully capture the flow dynamics between the flow paths (e.g., fluid communication between the flow paths at a flow path intersection). The intersection table can be used, for example, as a bookkeeping tool, when computing a solution from the band matrix. For example, in some cases, the flow models 334 can be operated by solving a matrix equation that involves the band matrix, and the operations on the band matrix can be modified or updated based on the intersection table. The intersection data 338 can be stored in any suitable form. For example, the intersection table can be stored in matrix form, vector form, etc.

In some implementations, the fluid flow simulation system 330 can also include a time marching module to perform calculations in a discretized time domain. For example, the governing flow equations may include derivatives or partial derivatives in the time domain, and the time marching module can calculate such quantities based on a time marching algorithm. Example time marching schemes include the backward Euler scheme, the Crank-Nicolson scheme, and others.

The solver 342 can include any information or modules that can be used to solve a system of equations. For example, the solver 342 can be a direct solver or another type of solver. In some implementations, the solver 342 receives inputs from the other components of the fluid flow simulation system 330 and generates a numerical solution for a variable of interest based on the inputs. The solution can be generated for some or all of the nodes in a discretized spatial domain. For example, the solver 342 may calculate values of fluid velocity, fluid pressure, or another variable over a spatial domain; the values can be calculated for an individual time step or multiple time steps. In some implementations, the solver 342 obtains a solution by executing the example process 500 shown in FIG. 5, or the solver 342 can obtain a solution using another technique.

In some cases, the solver 342 can be expressed as solving a matrix equation Ak=b, where k is the variable of interest that is computed by the solver 342, and elements of A and b are provided, for example, based on information from the flow models 334, the fluid system data 332, and other sources. As an example, the solver 342 may solve the matrix equation (M$\phi$=f) in Equation (4a) below. In this example, the values of M and f can be provided by the flow models 334, and the solver 342 can produce an output indicating appropriate values of $\phi$ that satisfy the matrix equation.

In some implementations, the intersection data 338 and the band matrix data 336 are provided as inputs to the solver 342. In some instances, the intersection data 338 and the band matrix data 336 provide a more compact representation of a flow model matrix derived from the flow models 334. For example, the flow model matrix can include in-band elements and off-band elements (e.g., as in the matrix M in Equation 4a below, or another type of flow model matrix). The band matrix data 336 can represent the in-band elements as a band matrix (e.g., in vector form), and the intersection data 338 can represent the off-band elements (e.g., as one or more tables). In some cases, the intersection table explicitly stores the non-zero off-band elements, and all other off-band elements are implicitly zero.

In some cases, the solver 342 operates more efficiently by performing matrix operations on the compact representation of the flow model matrix. For example, in some instances, the solver 342 can operate on the band matrix and access the intersection table to incorporate the off-band elements when appropriate. In some implementations, the intersection table can be accessed each time an operation or a type of operation is applied to the band matrix. For example, the flow intersection data in the intersection table can be indexed to the band matrix, for example, by row or column (or both); any time an operation is applied to a row or column of the band matrix, the operation can incorporate the intersection data 338 indexed to that row or column. In some cases, the intersection data 338 can be modified or updated as the band matrix is modified, or the intersection data 338 can remain unchanged when the band matrix is modified.

The analysis system 360 can include any systems, components, or modules that analyze, process, use, or access the simulation data generated by the fluid flow simulation system 330. For example, the analysis system 360 can be a real time analysis system that displays or otherwise presents fluid data (e.g., to a field engineer, etc.) during an injection treatment. In some cases, the analysis system 360 includes other simulators or a simulation manager that use the fluid simulation data to simulate other aspects of a well system. For example, the analysis system 360 can be a fracture simulation suite that simulates fracture propagation based on the simulated fluid flow data generated by the fluid flow simulation system 330. As another example, the analysis system 360 can be a reservoir simulation suite that simulates fluid migration in a reservoir based on the simulated fluid flow data generated by the fluid flow simulation system 330.

The example architecture 300 can be used to analyze non-compressible, two-dimensional flow in any type of physical system. In some implementations, the architecture 300 efficiently provides an accurate solution for one-dimensional (1D) incompressible flow equations. The architecture 300 can also be used to analyze other types of flow in other environments.

Figure 4:
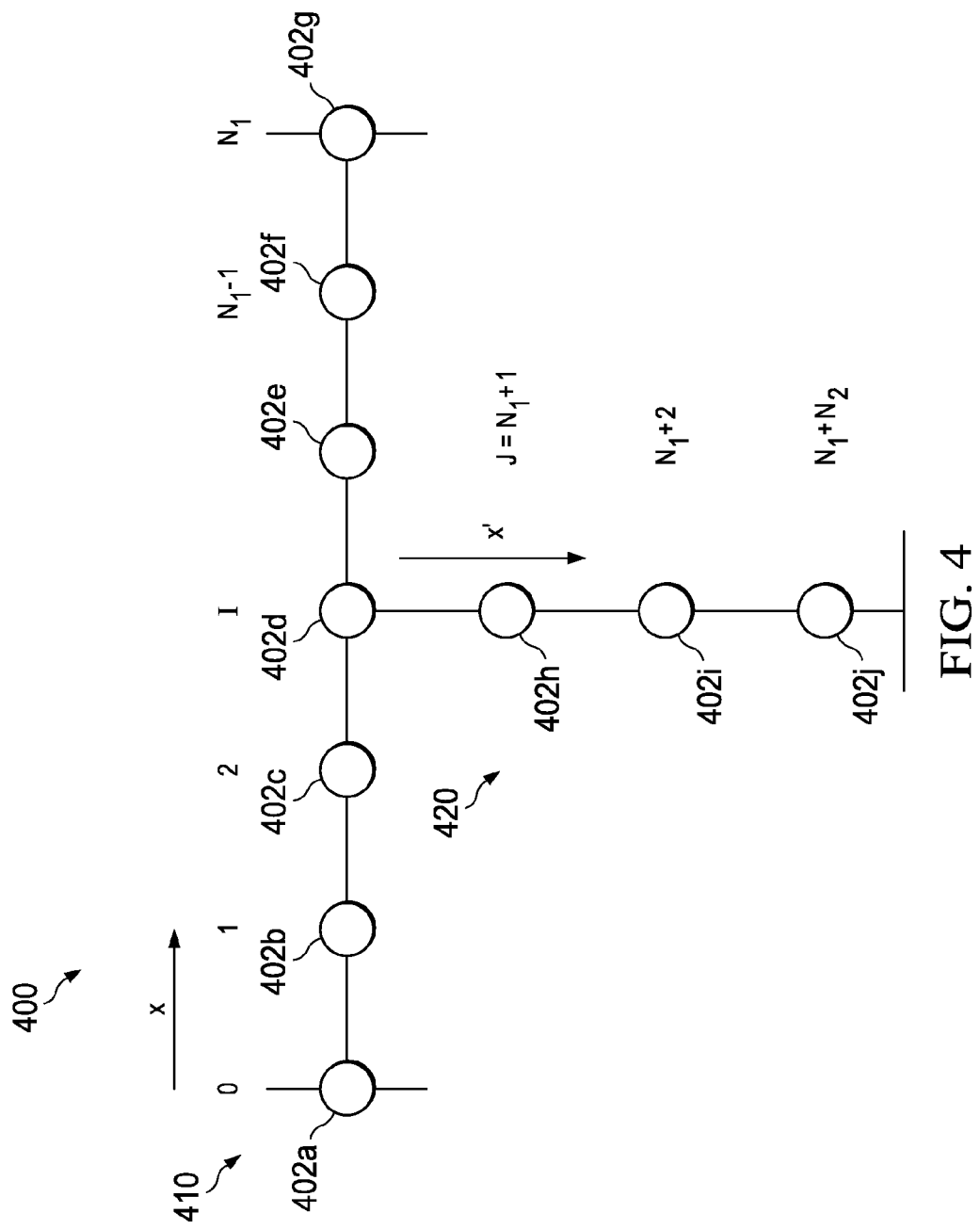
FIG. 4 is a diagram showing aspects of an example flow model.

FIG. 4 is a diagram showing aspects of an example flow model 400. The flow model 400 shown in FIG. 4 is an example of a one-dimensional flow model that includes multiple intersecting flow paths. The example flow model 400 includes a main flow path 410 and branch flow path 420 extending from the main flow path 410. The main flow path 410 and the branch flow path 420 can intersect at any angle, and they can extend in any direction.

The main flow path 410 includes multiple nodes 402a, 402b, 402c, 402d, 402e, 402f, 402g, and the branch flow path 420 includes additional nodes 402h, 402i, and 402j. Each node represents a respective location of fluid flow along one of the flow paths. The flow paths can extend through one, two, or three spatial dimensions. As such, the spatial dimension of a one-dimensional flow model does not necessarily correspond to a single physical spatial dimension. In some cases, a one-dimensional flow model can incorporate flow in more than one spatial dimension, for example, to account for intersecting flow paths, curved flow paths, etc.

In some examples, a flow model includes initial conditions, boundary conditions, connection conditions, governing flow equations, etc. The governing flow equations can include, for example, Navier-Stokes equations, advection-diffusion equations, continuity equations, and others. As an example, the governing flow equations for the respective flow paths in the flow model 400 can include the advection-diffusion equations for incompressible fluid flow:

$$\phi\phi_x - \mu\phi_{xx} = R_1(x) \quad (1)$$

$$\psi\psi_{x'} - \mu\psi_{x'x'} = R_2(x') \quad (2)$$

where $\phi$ represents a variable of interest (e.g., velocity, temperature, pressure, concentration, etc.) along the main flow path 410, and $\psi$ represents the same variable of interest along the branch flow path 420. Some example flow models include additional or different governing equations, and the governing flow equations can each include one or more variables of interest.

In Equations (1) and (2), $\phi_x$ represents a first-order spatial derivative of the variable $\phi$, and $\phi_{xx}$ represents a second-order spatial derivative of $\phi$; $\psi_{x'}$ represents a first-order spatial derivative of $\psi$, and $\psi_{x'x'}$ represents a second-order spatial derivative of $\psi$; $\mu$ represents the kinematic viscosity of the well system fluid; $R_1(x)$ represents a source term, and $R_2(x')$ represents another source term. The source terms $(R_1(x), R_2(x'))$ can incorporate any other internal or external systems, forces, or phenomena that influence the flow of fluid. For example, in some cases one or more of the source terms can account for the effects of gravity, an inflow or outflow of fluid, or other effects. The governing flow equations (including all source terms, flow variables, and boundary conditions) can vary over time, space, or both; or they can be constant over time, space, or both.

In the example shown in FIG. 4, the computational domain spans $x\in(0,1)$ and $x'\in(0,0.5)$, where x is the spatial variable representing locations on the main flow path 410 and x' is the spatial variable representing locations on the branch flow path 420. The governing flow equations can be numerically solved, for example, based on initial conditions and boundary conditions for the spatial variables x, x'. In some cases, the solver 342 can generate a numerical solution for the variable of interest at each node on both the main flow path 410 and the branch flow path 420. In some cases, the solver 342 can generate a numerical solution for additional or different variables (e.g., flow velocity, fluid pressure, temperature, concentration, etc.).

In the example shown in FIG. 4, the example flow model 400 includes a total of $N_1+N_2+1$ nodes; in particular, there are $N_1+1$ nodes on the main flow path 410 and $N_2$ nodes on the branch flow path 420. The coupling between the two occurs at node I (labeled 402d on the main flow path 410) and node J (labeled 402h on the branch flow path 420). Performing a finite difference discretization on each node i can produce a set of algebraic equations, as follows:

$$a_i\phi_{i-1} + b_i\phi_i + c_i\phi_{i+1} = f_i; \quad i \neq I, J \quad (3a)$$

$$a_i\phi_{i-1} + b_i\phi_i + c_i\phi_{i+1} = p\phi_J = f_i; \quad i = I \quad (3b)$$

$$q\phi_I + b_i\phi_i + c_i\phi_{i+1} = f_i; \quad i = J \quad (3c)$$

where i=0, 1, ..., $N_1+N_2$. In Equations (3a), (3b), and (3c), $\phi_i$ represents the variable of interest (the solution variable) at the $i^{th}$ node.

As shown in Equation (3a), discretizing the governing flow equations at nodes that are not connected to another flow path (i.e., where $i \neq I, J$) produces terms $(a_i\phi_{i-1} + b_i\phi_i + c_i\phi_{i+1})$ representing fluid flow within a flow path. In Equations (3b) and (3c), the terms $p\phi_J$ and $q\phi_I$ represent fluid flow between the two flow paths. For instance, as shown in Equation (3b), discretizing the governing flow equations at node I produces three terms $(a_i\phi_{i-1} + b_i\phi_i + c_i\phi_{i+1})$ representing flow within the main flow path 410, and an additional term $p\phi_J$ representing fluid flow between the main flow path 410 and the branch flow path 420; similarly, discretizing the governing flow equations at node J produces two terms $(b_i\phi_i + c_i\phi_{i+1})$ representing flow within the branch flow path 420, and an additional term $q\phi_I$ representing fluid flow between the main flow path 410 and the branch flow path 420.

The set of equations (i.e., Equations (3a), (3b), and (3c)) can be represented in matrix form as $$M\phi = f, \quad (4a)$$

where $$M = \begin{bmatrix} b_0 & c_0 & & & & & \\ a_1 & b_1 & c_1 & & & & \\ & & a_I & b_I & c_I & \cdots & p & \\ & & & & & & & \\ & q & \cdots & 0 & b_J & c_J & & \\ & & & & & & a_{N1+N2} & b_{N1+N2} \end{bmatrix} \quad (4b)$$

$$\varphi = \begin{bmatrix} \phi_0 \\ \vdots \\ \phi_I \\ \vdots \\ \phi_J \\ \vdots \\ \phi_{N1+N2} \end{bmatrix} \quad (4c)$$

$$f = \begin{bmatrix} f_0 \\ \vdots \\ f_I \\ \vdots \\ f_J \\ \vdots \\ f_{N1+N2} \end{bmatrix} \quad (4d)$$

In Equations (4a) and (4c), $\phi$ is a vector representing the variable of interest at multiple nodes.

In some implementations, the elements in the flow model matrix M and the elements in the vectors $\phi$ and f are scalar quantities. For example, each of the values $a_i$, $b_i$, $c_i$, $\phi_i$, and $f_i$ can be a scalar. In some implementations, the elements in the matrix M and the elements in the vectors $\phi$ and f are matrices. For example, where there are multiple variables of interest (e.g., combinations of velocity, temperature, pressure, concentration, etc.), each of the values $a_i$, $b_i$, $c_i$, $\phi_i$, and $f_i$ can be a matrix. As such, the matrix M and the vectors in the vectors $\phi$ and f can be in block form, and scalar operations can be substituted with appropriate matrix-vector operations.

The matrices and vectors in Equations (4a), (4b), (4c), and (4d) can be stored as a matrix representation, a vector representation, or a combination of these and other types of representations. In some implementations, the matrix M can be represented by multiple data structures. For instance, the matrix M can be represented as a band matrix and a table of off-band matrix elements. For example, the matrix elements ($b_i$) along the main diagonal, the matrix elements ($c_i$) one position above the main diagonal, the matrix elements ($a_i$) one position below the main diagonal can be represented as a tri-diagonal band matrix (having a bandwidth of three); the other elements, outside the bandwidth of the band matrix, can be represented as a separate data structure. In some cases, the off-band matrix elements are stored compactly (e.g., without explicitly storing the zero elements).

In some implementations, a band matrix can be stored using a vector representation. For example, the band matrix component of the flow model matrix M can be stored as three vectors:

$$a = \begin{bmatrix} a_1 \\ a_2 \\ \vdots \\ a_{N1+N2} \end{bmatrix}, \quad (5a)$$

$$b = \begin{bmatrix} b_0 \\ b_1 \\ \vdots \\ b_{N1+N2} \end{bmatrix}, \quad (5b)$$

$$c = \begin{bmatrix} c_0 \\ c_1 \\ \vdots \\ c_{N1+N2-1} \end{bmatrix}. \quad (5c)$$

The three vectors in Equations (5a), (5b), (5c) provide one example of a band matrix representing fluid flow within the respective flow paths of the example flow model 400. A band matrix can be stored as a full matrix representation, a different number of vectors, or other types of data structures.

The other components of the matrix M (i.e., the elements of M that are not represented in Equations (5a), (5b), and (5c)) can be stored as another data structure, separate from the band matrix. For example, the off-band components of the matrix M can be represented as a table:

TABLE I

Intersection Data from Equations (3b) and (3c)

| Matrix Indices | Matrix Element |
|---|---|
| (I, J) | p |
| (J, I) | q |

Table I provides one example of an intersection table representing fluid flow between the intersecting flow paths of the example flow model 400. An intersection table can include additional or different information, and the intersection table can be stored in any suitable form or format, using any suitable data structure, data type, etc.

In some implementations, the table can explicitly indicate whether each element is above or below the diagonal of the matrix. In some implementations, each element is designated as a "horizontal" element or a "vertical" element, or another type of designation can be used. The "horizontal" elements can be incorporated during the forward elimination operations on the tri-diagonal matrix; and the "vertical" elements can be incorporated during the backward substitution operations on the tri-diagonal matrix. In some cases, multiple tables can be used. For example, separate tables can be used for the "horizontal" and "vertical" elements.

In some implementations, a single flow path that does not intersect other flow paths can be represented by a band matrix, and the intersection table can be empty. For example, a one-dimensional flow model representing fluid flow within a single isolated flow path can, in some cases, be represented as a tri-diagonal matrix. In such cases, the tri-diagonal system can be solved directly without the intersection table. For example, the Thomas algorithm can be applied to solve the tri-diagonal system and obtain $\phi_i$ at each node. In other cases, where the flow model includes multiple intersecting flow paths, the discretized governing equations include additional terms outside the band matrix structure, and the additional terms can be populated into the intersection table. In such cases, the example process 500 can be used to solve the system of equations and obtain $\phi_i$ at each node based on the band matrix and the intersection table.

Figure 5:
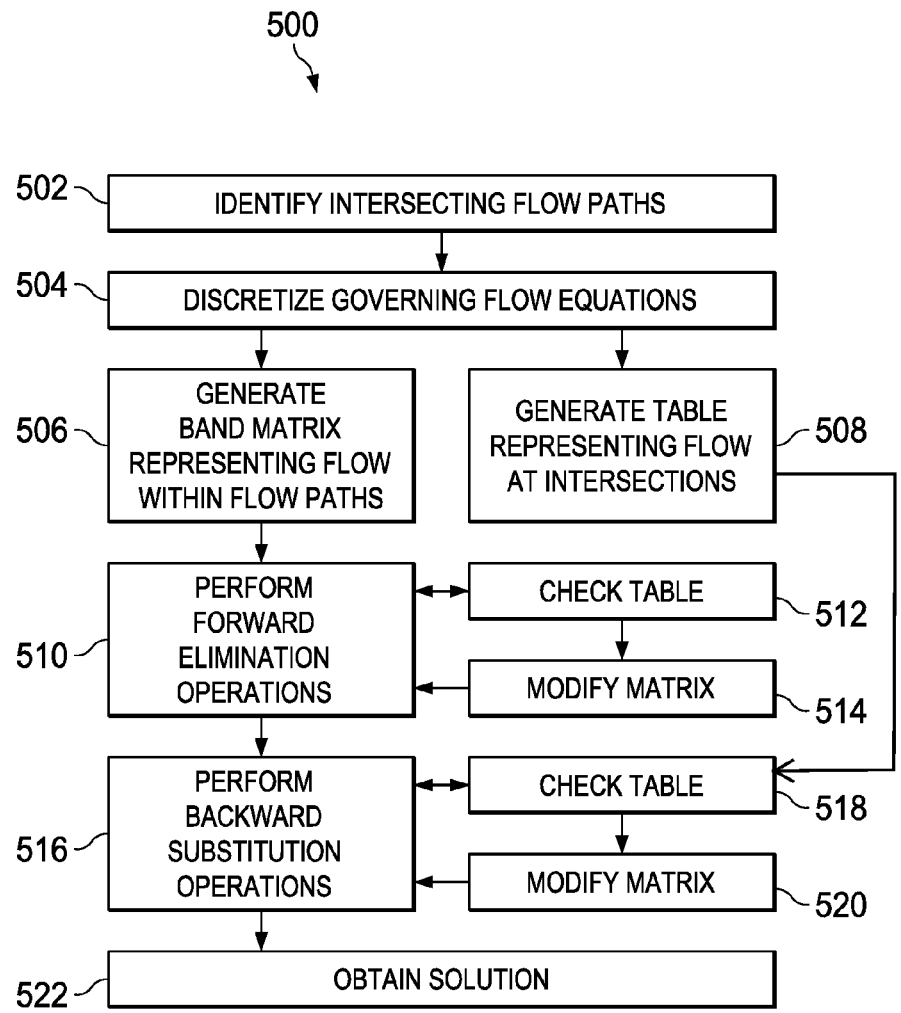
FIG. 5 is a flow chart showing an example technique for modeling fluid flow.

FIG. 5 is a flow chart showing an example process 500 for simulating fluid flow. All or part of the example process 500 may be computer-implemented, for example, using the features and attributes of the example computing system 200 shown in FIG. 2 or other computing systems. The process 500, individual operations of the process 500, or groups of operations may be iterated or performed in parallel, in series, or in another manner. In some cases, the process 500 may include the same, additional, fewer, or different operations performed in the same or a different order.

The example process 500 can be used to simulate incompressible flow in a variety of physical systems. In some implementations, the process 500 is used to simulate flow in a fluid injection or production system (e.g., in a wellbore, in a flow control device or flow conduit installed in a wellbore, etc.), within a subterranean formation (e.g., from a wellbore into reservoir media, through a rock matrix in the reservoir media, through fractures or discontinuities in the reservoir media, etc.), or combinations thereof. The process 500 may also be used to simulate flow in other environments, for example, outside the context of a well system. In some cases, some or all of the operations in the example process 500 can be implemented by a direct solver in a fluid flow simulation system.

The example process 500 can be used to simulate the flow of various fluids. In some cases, the process 500 is used to simulate one or more well system fluids. Here, the term "well system fluid" is used broadly to encompass a wide variety of fluids that may be found in or near, or may be used in connection with, a well system. Well system fluids can include one or more native fluids that reside in a subterranean region (e.g., brine, oil, natural gas, etc.), one or more fluids that have been or will be injected into a subterranean region (e.g., fracturing fluids, treatment fluids, etc.), one or more fluids that have been or will be communicated within a wellbore or within one or more tools installed in the well bore (e.g., drilling fluids, hydraulic fluids, etc.), and other types of fluids.

The example process 500 can simulate fluid flow based on a one-dimensional flow model. The flow model can include nodes of multiple discretized one-dimensional flow paths. In some instances, the flow paths intersect, for example, at an intermediate point on one or both of the flow paths. For example, the process 500 can use the example flow model 400 shown in FIG. 4, or another type of flow model. The flow model can also include governing equations and associated variables for each of the nodes. For example, the flow model can include one or more of the example Equations (1) and (2) shown above. The flow model can include other types of variables or equations.

In some implementations, the one-dimensional flow model is configured to model the flow of well system fluid in a fracture in a subterranean region, where the nodes of the flow model represent a sequence of locations at which fluid can flow through the fracture. The nodes can include end point nodes, intersection nodes, intermediate nodes, or other types of nodes. In some cases, the flow model includes end point nodes at either end of each flow path, and multiple intermediate nodes between the end point nodes. In some cases, one or more of the end point nodes or intermediate nodes is an intersection node that is shared by another flow path. In the example shown in FIG. 4, node 402d is an example of an intersection node; node 402d is an intermediate node on the main flow path 410 and an end point node on the branch flow path 420.

At 502, intersecting flow paths are identified. In some cases, the intersecting flow paths are identified by identifying an intersection node shared by two flow paths in the flow model. Intersecting flow paths can be identified in another manner, for example, based on flow model data or other information.

At 504, the governing equations are discretized. The governing flow equations can be provided by the flow model or another source. The governing flow equations can include a nonlinear system of partial differential equations with multiple variables of interest. The governing equations can be discretized, for example, according to a finite difference technique or another discretization method. Equations (3a), (3b), and (3c) show an example of discretized governing equations. The discretization for each node, in the example represented by Equations (3a), (3b), and (3c), incorporates fluid communication with an adjacent node in each flow direction. The discretization can incorporate fluid communication across more than one adjacent node in each flow direction. For example, the discretization at each node can incorporate fluid communication across two or three adjacent nodes in each direction of flow.

At 506, a band matrix representing flow within each of the flow paths is generated. The band matrix can be stored as a full matrix representation, a vector representation, or another type of representation. In some instances, a tri-diagonal band matrix can be represented as three vectors, where one of the vectors represents the elements on the main diagonal of the band matrix, one of the vectors represents the elements one position above the main diagonal, and the other vector represents the elements one position below the main diagonal. For example, Equations (5a), (5b), and (5c) represent a tri-diagonal band matrix in vector form. The band matrix can be represented in full matrix form, for example, by storing the tri-diagonal elements in a full matrix (e.g., with all other matrix elements set to zero).

The band matrix generated at 506 can have a bandwidth. The bandwidth can be determined, in some instances, by the discretization of the governing equations. For example, where the governing equations are discretized at each node based on one adjacent node in each direction, as in Equations (3a), (3b), and (3c), the band matrix can have a bandwidth of three, corresponding to a tri-diagonal matrix structure. Where the governing equations are discretized at each node based on two adjacent node in each direction, the band matrix can have a bandwidth of five, corresponding to a penta-diagonal matrix structure. The bandwidth of the band matrix can determine a number of vectors used to store the band matrix in a vector representation. For example, three vectors are used in the vector representation set forth in Equations (5a), (5b), and (5c), where the band matrix has a bandwidth of three.

At 508, a table representing flow at the intersections between the flow paths is generated. The table can have any suitable form or format. The table can include the information set forth in Table I above, or the table can include additional or different types of information. In some cases, the table includes one or more entries for each flow path connection in the flow model, and each entry in the table can be associated with one of the flow path connections. In some examples, each entry includes indices that correspond to an off-band position in the band matrix, and a corresponding value (or set of values) derived from the governing flow equations. In some implementations, a single table or multiple tables can be used. For example, a first table can include off-band matrix elements below the main diagonal, and a second, different table can represent off-band matrix elements above the main diagonal.

In some implementations, the band matrix and the intersection table represent components of a matrix equation. For example, the band matrix and the intersection can represent the flow model matrix M in the matrix equation $M\phi=f$ set forth above as Equation (4a). Other components of the matrix equation (e.g., $\phi$, f) can be represented as vectors or other types of data structures.

At 510, forward elimination operations are performed on the band matrix. The forward elimination operations can be applied to the band matrix to convert the band matrix to an upper-triangular form (e.g., echelon form). In some cases, each forward elimination operation converts an element below the main diagonal in the band matrix to zero, and modifies other elements in the matrix accordingly. In some cases, other components of a matrix equation (e.g., $\phi$, f) are also modified by the forward elimination operation.

In the example process 500 shown in FIG. 5, at 512, the intersection table can be checked in connection with each forward elimination operation. For example, the intersection table can be checked for row indices (or column indices, or both) corresponding to a row (or column, or both) of the band matrix that was (or will be) modified by a particular forward elimination operation. If the intersection table includes an entry having the relevant indices, at 514, the band matrix can be modified to incorporate the information specified by the entry. For example, with reference to the example Table I above, when a forward elimination operation is applied to row J, the matrix element q can be used in the forward elimination operation or otherwise incorporated into the band matrix. In some cases, the forward elimination operations can collectively incorporate all below-diagonal off-band elements stored in the intersection table. The forward elimination operations can incorporate the intersection data in another manner.

At 516, backward substitution operations are performed on the band matrix. The backward substitution operations can be applied to the band matrix to convert the band matrix to a diagonal form, a reduced row echelon form or another form. In some cases, each backward substitution operation converts an element above the diagonal in the band matrix to zero, and modifies other elements in the matrix accordingly. In some cases, other components of a matrix equation (e.g., $\phi$, f) are also modified by the backward substitution operation.

In the example process 500 shown in FIG. 5, at 518, the intersection table can be checked in connection with each backward substitution operation. For example, the intersection table can be checked for column indices (or row indices, or both) corresponding to a column (or row, or both) of the band matrix that was (or will be) modified by a particular backward substitution operation. If the intersection table includes an entry having the relevant indices, at 520, the band matrix can be modified to incorporate information specified by the entry. For example, with reference to the example Table I above, when a backward substitution operation is applied to column J, the matrix element p can be used in the backward substitution operation or otherwise incorporated into the band matrix. In some cases, the backward substitution operations can collectively incorporate all above-diagonal off-band elements stored in the intersection table. The backward substitution operations can incorporate the intersection data in another manner.

In some implementations, the backward substitution operations (at 518) can be performed without modifying the band matrix (at 520). For example, upon each backward substitution operation, one or more equations for the solution variables can be extracted from a row of the band matrix and other data structures (e.g., vectors $\phi$, f). In such cases, if the intersection table includes an entry that affects the backward substitution operation, the extracted equations can be modified to incorporate the relevant intersection table information. In some cases, the extracted equations can be modified in addition to, or instead of, modifying the band matrix.

At 522, a solution is obtained. The solution can be obtained, for example, based on the band matrix, values in the vectors $\phi$, f, or a combination of these and other objects after completing all the backward substitution operations at 516 and possibly other operations. In some cases, the solution vector $\phi$ includes values of one or more fluid flow variables at each node in the flow model. For example, the solution vector $\phi$ can indicate a flow rate, pressure, temperature, concentration, or values for other variables at each discretized location on the intersecting flow paths.

FIGS. 6A, 6B, 6C, 6D, 7A, 7C, 7D, 8A, 8B, and 8C are plots showing example flow models and example data for flow simulations based on the example process 500 shown in FIG. 5. In these examples, the process 500 operates on nonlinear partial differential equations (PDEs) of the form shown in Equations (1) and (2) above. The process 500 can operate on other types of governing flow equations, including other types of nonlinear PDEs. The example plots show data for numerical simulations of one-dimensional flow models that include one or more intersecting flow paths.

Figure 6A:
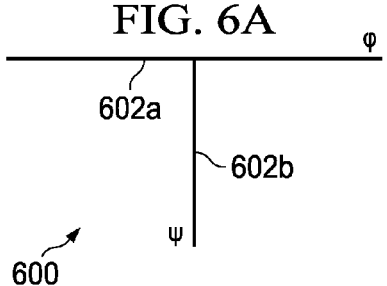
FIG. 6A is a diagram showing aspects of an example flow model.
Figure 6B:
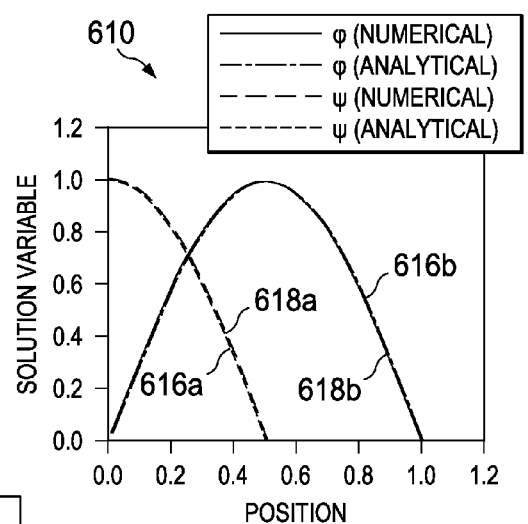
FIGS. 6B, 6C and 6D are plots showing data from example numerical simulations using the example flow model 600 shown in FIG. 6A.
Figure 6C:
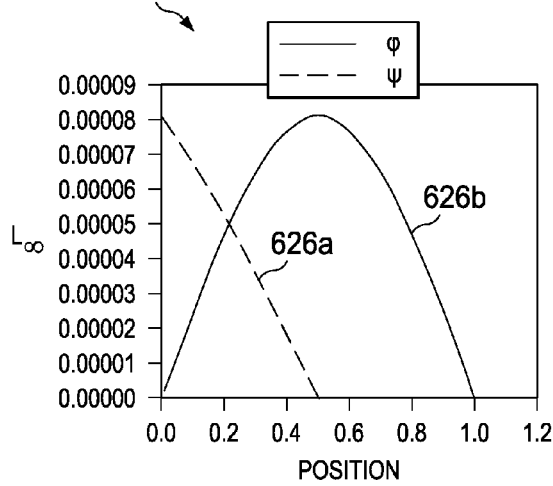

FIGS. 6B and 6C show data from an example numerical simulation of a steady state nonlinear PDE with one solution variable, based on the example flow model 600 shown in FIG. 6A. The flow model 600 includes the intersecting flow paths shown in FIG. 6A. In particular, the flow model includes a main flow path 602a that intersects a branch flow path 602b. The plots in FIGS. 6B and 6C show solutions for the solution variable $\phi$ on the main flow path 602a, and solutions for the solution variable $\psi$ on the branch flow path 602b. A term representing flow between the flow paths can be included in the discretized governing flow equations, for example, for an intersection node on the main branch.

The plot 610 shown in FIG. 6B includes a vertical axis that represents a range of values for the solution variable, and a horizontal axis 604 representing a range of values for the position variables x and x'. The curves 616a and 616b represent data generated by the numerical simulation, and the curves 618a and 618b represent the analytical solutions. In particular, curve 616a represents the numerical solution for $\psi$; curve 618a represents the analytical solution for $\psi$; curve 616b represents the numerical solution for $\phi$; and curve 618b represents the analytical solution for $\phi$.

In the example shown in FIG. 6B, the analytical solutions are manufactured solutions that are used to validate the numerical technique, and a comparison between the analytical and numerical solutions shows a high degree of accuracy. In particular, the curves 616a and 618a overlap in the plot 610, which represents agreement between the numerical and analytical solutions for $\psi$. And the curves 616b and 618b overlap in the plot 610, which represents agreement between the numerical and analytical solutions for $\psi$.

In the example shown in FIG. 6B, the analytical solutions represented by the curves 618a and 618b were selected a priori. In particular, the analytical solutions $\phi(x)=\sin \pi x$ and $\psi(x)=\cos \pi x'$ were chosen, and the computational domain spans $x=(0,1)$ and $x'=(0,0.5)$. FIG. 6B shows the numerical solution obtained at $t=1$, with time step $\Delta t=0.01$, and the number of grid points $N_1=100$, $N_2=100$.

The values plotted in FIG. 6C show the spatial accuracy of the example numerical solutions shown in FIG. 6B. The plot 620 shown in FIG. 6C includes a vertical axis that represents a range of values for the $L_\infty$ norm of the solution variable, and a horizontal axis representing a range of values for the position variables x and x'. The $L_\infty$ norm values plotted in FIG. 6C provide a measure of the error in the numerical simulations based on a comparison to the manufactured analytical solutions. As shown in the plot 620, the $L_\infty$ norm for both $\phi$ and $\psi$ remain below 0.00009 for all values of x and x'.

Figure 6D:
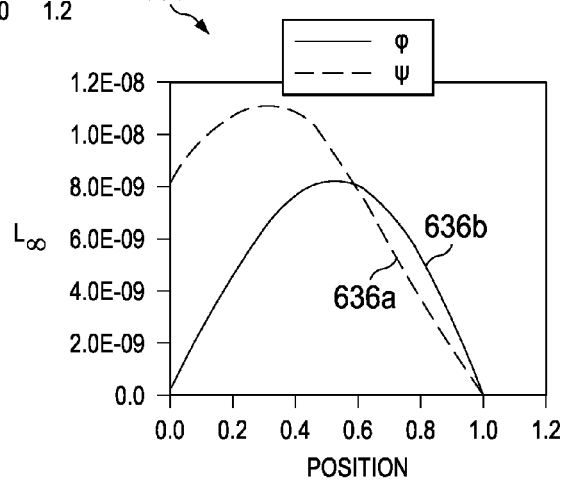

The values plotted in FIG. 6D show the spatial accuracy of numerical solutions produced by an example simulation using the example flow model 600 and unsteady nonlinear PDEs. The numerical simulation used analytical solutions $\phi_{an}=(1+e^{-t})x^3$ and $\psi_{an}=(1+e^{-t})(0.125+x^3)$, and was otherwise the same as the numerical simulation that was used to produce the data represented in FIGS. 6B and 6C. As shown in the plot 630, the $L_\infty$ norm for both $\phi$ and $\psi$ remain below $1.2(10)^{-8}$ for all values of x and x'.

Figure 7A:
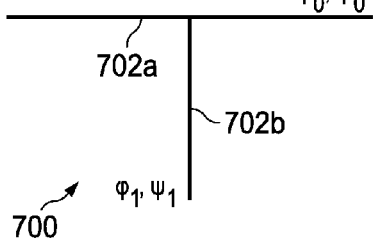
FIG. 7A is a diagram showing aspects of an example flow model.
Figure 7B:
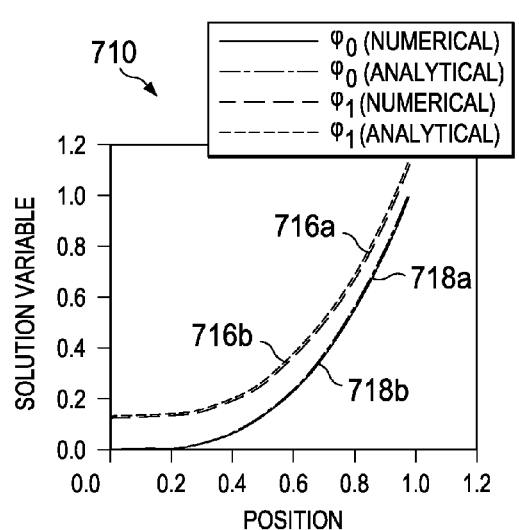
FIGS. 7B and 7C are plots showing data from example numerical simulations using the example flow model 700 shown in FIG. 7A.
Figure 7C:
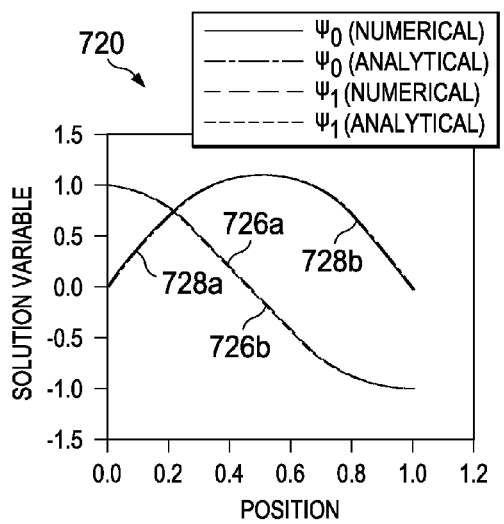

FIGS. 7A, 7B, and 7C show an example of an unsteady nonlinear PDE with two solution variables on each flow path. The flow model 700 includes the intersecting flow paths shown in FIG. 7A. In particular, the flow model includes a main flow path 702a that intersects a branch flow path 702b. In this example, $\phi_0$ and $\phi_1$ represent a first solution variable on the main flow path 702a and the branch flow path 702b, respectively; and $\psi_0$ and $\psi_1$ represent another solution variable on the main flow path 702a and the branch flow path 702b, respectively. As an example, $\phi_0$ and $\phi_1$ can represent fluid velocity, and $\psi_0$ and $\psi_1$ can represent fluid pressure. As another example, $\phi_0$ and $\phi_1$ can represent fluid temperature, and $\psi_0$ and $\psi_1$ can represent fluid concentration. In the example shown, the analytical solutions for the main flow path 702a are $\phi_{0,an}=(1+e^{-t})x^3$, and $\psi_{0,an}=t \sin \pi x$. The analytical solutions for the branch flow path 702b are $\phi_{1,an}=(1+e^{-t})(0.125+x^3)$, and $\psi_{1,an}=t \cos \pi x$. The numerical solution is obtained for t=1, $\Delta t$=0.01 and $N_0$=100, $N_1$=100.

The plot 710 shown in FIG. 7B is similar to the plot shown in FIG. 6B. The plot 710 shows the numerical and analytical solutions for the first solution variable ($\phi_0$ and $\phi_1$). The curves 716a and 718a represent data generated by the numerical simulation of the flow model 700, and the curves 716b and 718b represent the analytical solutions. In the example shown in FIG. 7B, a comparison between the analytical and numerical solutions shows a high degree of accuracy. In particular, the curves 716a and 716b overlap and the curves 718a and 718b overlap, which represents agreement between the numerical and analytical solutions for the first variable of interest ($\phi_0$ and $\phi_1$).

The plot 720 shown in FIG. 7C is also similar to the plot shown in FIG. 6B. The plot 720 shows the numerical and analytical solutions for the second solution variable ($\psi_0$ and $\psi_1$). The curves 726a and 728a represent data generated by the numerical simulation of the flow model 700, and the curves 726b and 728b represent the analytical solutions. In the example shown in FIG. 7C, a comparison between the analytical and numerical solutions shows a high degree of accuracy. In particular, the curves 726a and 726b overlap and the curves 728a and 728b overlap, which represents agreement between the numerical and analytical solutions for the second variable of interest ($\phi_0$ and $\phi_1$).

Figure 8A:
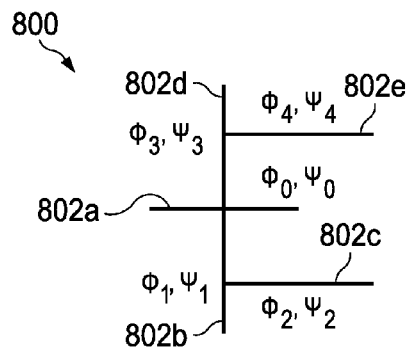
FIG. 8A is a diagram showing aspects of an example flow model.

FIG. 8A show another example flow model 800 that can be used in numerical simulations of an unsteady nonlinear PDE with two solution variables on each flow path. The flow model 800 includes multiple branch flow paths 802b, 802c, 802d, 802e intersecting the main flow path 802a. The analytical solutions for the main flow path 802a are $\phi_{0,an}=(1+e^{-t})x^3$, $\psi_{0,an}=t \sin \pi x$. The analytical solutions for the branch flow paths 802b and 802c are $\phi_{1,an}=\phi_{3,an}=(1+e^{-t})(0.125+x^3)$, $\psi_{1,an}=\psi_{3,an}=t \cos \pi x$. The analytical solutions for the branch flow path 802d and 802e are $\phi_{2,an}=\phi_{4,an}=(1+e^{-t})(0.25+x^3)$, $\psi_{2,an}=\psi_{4,an}=t \sin \pi x$. The numerical solution obtained for t=1, $\Delta t$=0.01 and $N_0$=$N_1$=$N_2$=$N_3$=$N_4$=100 showed accuracy that is comparable to the degree of accuracy represented in FIGS. 7B and 7C. For example, the numerical and analytical solutions overlap in similar plots.

Figure 8B:
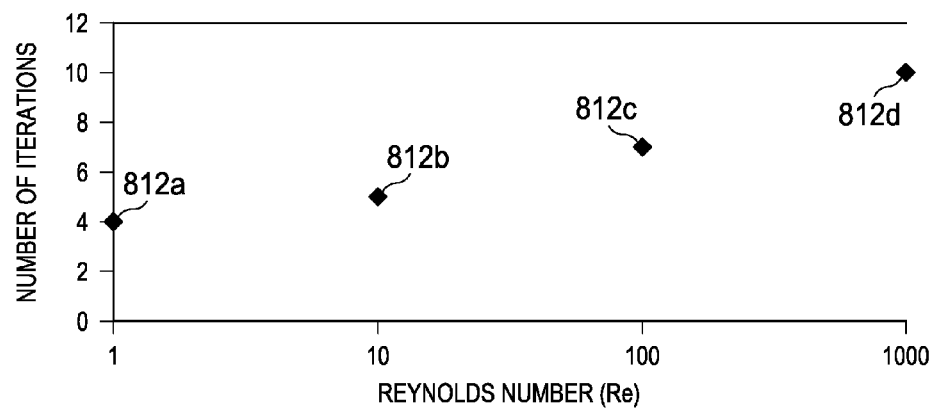
FIGS. 8B and 8C are plots showing aspects of example numerical simulations using the example flow model 800 shown in FIG. 8A.
Figure 8C:
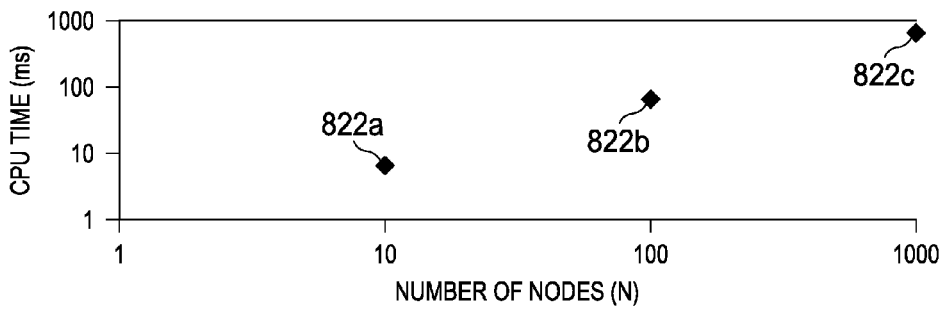

In some implementations, the techniques described here can provide a fluid simulation that is robust over a wide range of simulation and fluid parameters. The values plotted in FIGS. 8B and 8C show performance aspects of several example numerical simulations. In particular, FIGS. 8B and 8C show data from simulations where numerical solutions were obtained according to the example process 500 shown in FIG. 5, up to t=1 for N=100.

The plot 820 shown in FIG. 8B includes a vertical axis representing the number of iterations per time step for a number of example simulations using the example flow model 800 shown in FIG. 8A, and a horizontal axis representing the Reynolds number ($1/\mu$) of the simulated fluid. The Reynolds number (Re) is the (unitless) ratio of inertial forces to viscous forces of the simulated fluid. The points 812a, 812b, 812c, and 812d show the average number of iterations in each time step for respective values of the Reynolds number. In the example shown in FIG. 8B, the Reynolds number ranges from 1 to 1000, four orders of magnitude on the logarithmic scale of the horizontal axis. As shown in the plot 810, the average number of iterations per time step is robust across the full plotted range of Reynolds number values.

The plot 820 shown in FIG. 8C includes a vertical axis representing CPU time in milliseconds, and a horizontal axis representing the number of nodes on each branch in example simulations using the example flow model 800 shown in FIG. 8A. The points 822a, 822b, and 822c show that, in this example, the CPU time is robust to additional nodes on the flow paths.

Some embodiments of subject matter and operations described in this specification can be implemented in digital electronic circuitry, or in computer software, firmware, or hardware, including the structures disclosed in this specification and their structural equivalents, or in combinations of one or more of them. Some embodiments of subject matter described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A client and server are generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). The relationship of client and server arises by virtue of computer programs running on the respective computers and having a client-server relationship to each other.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of examples have been described. Nevertheless, it will be understood that various modifications can be made. Accordingly, other implementations are within the scope of the following claims.

The invention claimed is:

1. A fluid flow modeling method comprising:
generating, by operation of one or more computers, flow model data associated with a one-dimensional flow model for well system fluid in a fracture network in a subterranean region, the flow model representing flow paths that intersect at a flow path intersection in the fracture network, the flow model data including:
a band matrix representing fluid flow within the respective flow paths; and
an intersection table representing fluid flow between the flow paths at the flow path intersection; and
simulating, using the one or more computers, fluid flow in the fracture network using the band matrix and the intersection table.

2. The method of claim 1, wherein simulating fluid flow includes solving for values of a fluid flow variable for multiple locations along one or more of the flow paths.

3. The method of claim 2, wherein the fluid flow variable includes at least one of fluid velocity or fluid pressure.

4. The method of claim 2, wherein solving for values of the fluid flow variable includes:
converting the band matrix to an upper triangular representation by a forward elimination algorithm; and
converting the upper triangular representation to a diagonal representation by a backward substitution algorithm.

5. The method of claim 4, wherein the forward elimination algorithm includes a sequence of forward elimination operations, and at least one of the forward elimination operations is based on the intersection table.

6. The method of claim 4, wherein the backward substitution algorithm includes a sequence of backward substitution operations, and at least one of the backward substitution operations is based on the intersection table.

7. The method of claim 1, wherein the band matrix comprises a full matrix representation.

8. The method of claim 1, wherein the band matrix comprises a vector representation.

9. The method of claim 8, wherein the vector representation includes a number of vectors, and the number of vectors corresponds to a bandwidth of the band matrix.

10. The method of claim 1, wherein the intersection table includes:
indices corresponding to off-band matrix positions of a flow model matrix; and
values representing fluid flow between the flow paths according to discretized governing flow equations of the flow model.

11. The method of claim 10, wherein the band matrix includes other values representing fluid flow within the flow paths according to the discretized governing flow equations of the flow model.

12. The method of claim 11, comprising generating the values included in the band matrix and the intersection table according to a finite difference discretization of the governing flow equations.

13. The method of claim 11, wherein the band matrix has a bandwidth that is determined by the discretization of the governing flow equations.

14. The method of claim 1, wherein the flow model represents multiple flow paths that each intersect a common flow path at respective flow path intersections, the intersection table includes multiple entries, and each entry corresponds to one of the flow path intersections.

15. The method of claim 1, wherein the flow model represents a flow loop that intersects another flow path at multiple flow path intersections, the intersection table includes multiple entries, and each entry corresponds to one of the flow path intersections.

16. A non-transitory computer-readable medium storing instructions that, when executed by data processing apparatus, perform operations comprising:
   accessing a one-dimensional flow model representing multiple flow paths for well system fluid, the flow paths intersecting at a flow path intersection;
   generating, based on the flow model:
      a band matrix representing fluid flow within the respective flow paths; and
      an intersection table representing fluid flow between the flow paths at the flow path intersection; and
   executing the flow model based on the band matrix and the intersection table.

17. The computer-readable medium of claim 16, wherein the flow model includes a plurality of nodes for each of the flow paths, and the nodes represent locations of fluid flow through a fracture in a subterranean region.

18. The computer-readable medium of claim 16, wherein the flow model includes a plurality of nodes for each of the flow paths, and the nodes represent locations of fluid flow through a conduit installed in a wellbore.

19. The computer-readable medium of claim 16, wherein the flow model includes a plurality of nodes representing respective flow locations along each of the flow paths, and the plurality of nodes include an intersection node representing the location of the flow path intersection.

20. The computer-readable medium of claim 19, wherein the band matrix includes a plurality of matrix rows, and each matrix row includes values from a plurality of governing flow equations discretized for one of the plurality of nodes.

21. The computer-readable medium of claim 20, wherein the intersection table includes one or more values from the plurality of governing flow equations discretized for the intersection node.

22. The computer-readable medium of claim 19, wherein operating the flow model includes solving for values of a fluid flow variable for each of the nodes.

23. A fluid flow modeling system comprising one or more computers that include:
   flow model data associated with a flow model for well system fluid, the flow model representing flow paths that intersect at a flow path intersection, the flow model data including:
      a band matrix representing fluid flow within the respective flow paths; and
      an intersection table representing fluid flow between the flow paths at the flow path intersection; and
   a solver module operable to compute, based on the band matrix and the intersection table, values of a fluid flow variable for a location on at least one of the flow paths.

24. The fluid flow modeling system of claim 23, wherein the band matrix comprises a vector representation of in-band elements of a flow model matrix, and the intersection table comprises a table representation of off-band elements of the flow model matrix.

25. The fluid flow modeling system of claim 24, wherein the intersection table includes:
   indices to off-band positions in the flow model matrix; and
   one or more values from a discretized governing flow equation representing fluid flow at the flow path intersection.

26. The fluid flow modeling system of claim 25, wherein the band matrix includes other values from the discretized governing flow equation.

* * * * *